United States Patent
Isoda et al.

(10) Patent No.: US 6,852,357 B2
(45) Date of Patent: Feb. 8, 2005

(54) PROCESS FOR PREPARING RADIATION IMAGE STORAGE PANEL BY GAS PHASE DEPOSITION

(75) Inventors: Yuji Isoda, Kanagawa (JP); Yasuo Iwabuchi, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/395,223

(22) Filed: Mar. 25, 2003

(65) Prior Publication Data

US 2003/0186023 A1 Oct. 2, 2003

(30) Foreign Application Priority Data

Mar. 26, 2002 (JP) ........................................ 2002-086653

(51) Int. Cl.$^7$ .............................................. B32B 31/26
(52) U.S. Cl. .................... 427/70; 427/255.39; 427/377; 250/484.4; 250/486.1
(58) Field of Search ..................... 427/70, 377, 255.39; 250/484.4, 486.1

(56) References Cited

U.S. PATENT DOCUMENTS 6,290,873 B1 * 9/2001 Takahashi et al. ..... 252/301.4 H

* cited by examiner

*Primary Examiner*—Alexander S. Thomas
(74) *Attorney, Agent, or Firm*—Sughrue Mion, PLLC

(57) ABSTRACT

A radiation image storage panel composed of a support and a phosphor film of a stimulable europium activated cesium bromide phosphor having the formula (I):

$$CsBr \cdot M^{I}X - aM^{II}X'_2 + bM^{III}X''_3 : zEu \qquad (I)$$

[$M^{I}$ is an alkali metal element; $M^{II}$ is an alkaline earth metal element or a divalent metal element; $M^{III}$ is a rare earth element or a trivalent metal element; each of X, X' and X" is a halogen; and $0 \leq a < 0.5$, $0 \leq b < 0.5$, $0 \leq c < 0.5$, and $0 < z < 1.0$] is prepared by the steps of depositing on the support a prismatic europium activated cesium bromide phosphor crystal layer on the support in a gas phase; and heating the crystal layer at a temperature of $<300\,°$ C. but $>50°$ C. for 1 to 8 hours in an inert gas atmosphere which may contain a small amount of oxygen or hydrogen.

10 Claims, 2 Drawing Sheets

PROCESS FOR PREPARING RADIATION IMAGE STORAGE PANEL BY GAS PHASE DEPOSITION

FIELD OF THE INVENTION

The present invention relates to a process for preparing a radiation image storage panel which is favorably employable in a radiation image recording and reproducing method utilizing stimulated emission of a stimulable phosphor.

BACKGROUND OF THE INVENTION

When the stimulable phosphor is exposed to radiation such as X-rays, it absorbs and stores a portion of the radiation energy. The stimulable phosphor then emits stimulated emission according to the level of the stored energy when the phosphor is exposed to electromagnetic wave such as visible light or infrared rays (i.e., stimulating light).

A radiation image recording and reproducing method utilizing the stimulable phosphor has been widely employed in practice. The method employs a radiation image storage panel comprising the stimulable phosphor, and comprises the steps of causing the stimulable phosphor of the storage panel to absorb radiation energy having passed through an object or having radiated from an object; sequentially exciting the stimulable phosphor with a stimulating light to emit stimulated light; and photo-electrically detecting the emitted light to obtain electric signals giving a visible radiation image. The storage panel thus treated is subjected to a step for erasing radiation energy remaining therein, and then stored for the use in the next recording and reproducing procedure. Thus, the radiation image storage panel can be repeatedly used.

The radiation image storage panel (often referred to as stimulable phosphor sheet) has a basic structure comprising a support (or substrate) and a stimulable phosphor layer provided thereon.

The phosphor layer is generally formed by coating a dispersion of phosphor particles in a binder solution on the support and drying the coated dispersion, and therefore comprises a binder and phosphor particles dispersed therein.

It is desired that radiation image storage panels used in these methods have sensitivity as high as possible.

It is known that a radiation image storage panel having on a support a stimulable phosphor film prepared by gas phase deposition such as vacuum vapor deposition or sputtering gives a reproduced radiation image with high sensitivity as well as high sharpness.

There is already known a method in which a stimulable phosphor layer of a radiation image storage panel is formed by electron beam evaporation (which is a kind of vapor deposition method). In the method, an electron beam generated by an electron gun is applied onto a stimulable phosphor or its starting materials (i.e., evaporation source) to heat and vaporize the source, to deposit the vapor to form a phosphor layer on the surface of the support. Thus formed phosphor layer consists essentially of prismatic crystals of the stimulable phosphor. In the phosphor layer, there are cracks among the prismatic crystals of the stimulable phosphor. For this reason, the stimulating rays are efficiently applied to the phosphor and the stimulated emission are also efficiently taken out. Hence, a radiation image of high sharpness can be obtained with high sensitivity.

Japanese Patent No. 3,041,717 describes a process for preparing a radiation image storage panel which comprises the steps of depositing on a support a layer of stimulable phosphor or stimulable phosphor matrix component having a thickness of 200 to 600 μm, and heating the deposited layer at T° C. ($0.40T_m$<T<$0.75T_m$, $T_m$ is a melting point of the stimulable phosphor matrix component) for 2 to 10 hours in an atmosphere containing the activator component.

Japanese Patent Publication No. 7-18957 discloses a process for preparing a radiation image storage panel comprising the steps of depositing a layer of stimulable phosphor comprising an activated stimulable phosphor and subsequently heating the deposited layer in the presence of a vapor of the activator component vaporized from the activator component source placed within the deposition vessel but far from the deposited layer.

In both of the above-mentioned processes, the explicitly described temperature for the heating step is a high temperature of 300° C. to 600° C. Further, the explicitly described stimulable phosphor is RbBr:Tl. The activator component Tl of this phosphor has a vapor pressure higher than the vapor pressure of RbEr. Therefore, the activator component is apt to leave from the deposited phosphor layer, and hence the heating step should be carried out in an atmosphere containing a gaseous activator component.

Japanese Patent Publication No. 6-54360 discloses a process for forming a stimulable phosphor layer containing an activator component which comprises the steps of depositing a stimulable phosphor matrix component layer and subsequently depositing on the matrix component layer the activator component so as to diffuse into the matrix layer. The activator component layer can be placed on the matrix layer otherwise, the matrix layer can he heated in the presence of a gaseous activator component.

SUMMARY OF THE INVENTION

The present invention has an object to provide a process for preparing a radiation image storage panel which gives a reproduced radiation image of a high quality with a high sensitivity.

The present inventors have studied a process for forming a stimulable europium activated cesium bromide phosphor by gas phase deposition. As a result, they have discovered that if the deposited phosphor layer is composed of good prismatic phosphor crystals and the deposited layer is subsequently heated under the specific conditions, the amount of stimulated emission released from the produced stimulable phosphor layer increases prominently. This means that the radiation image storage panel having thus processed stimulable phosphor layer shows a prominently high sensitivity.

It is considered that the above-mentioned favorable phenomenon takes place for the following reasons.

The deposited phosphor layer formed by gas phase deposition contains an oxygen atom which are combined with the activator component (Eu) to give a complex. In the phosphor crystals, the oxygen atom serves to compensate the electric charge of the activator component Eu (which is present in the form of $Eu^{2+}$ and/or $Eu^{3+}$). When the phosphor layer is subjected to the heat treatment, the oxygen atom separates from the activator component and diffuses in the phosphor layer. As a result, the activator component Eu is liable to combine with electron. This means that the efficiency of activation and efficiency of electron movement increase and the amount of the stimulated emission released from the phosphor layer increases. It is understood that the complex of an oxygen atom and an activator component Eu is generally present in the vicinity of an interface between the phosphor crystals and the surrounding atmosphere. However, if the prismatic crystals are well shaped and the well shaped prismatic crystals increase, the total surface of the phosphor crystals decreases and the above-mentioned effects are prominently enhanced.

Accordingly, the present invention resides in a process for preparing a radiation image storage panel comprising a support and a phosphor film comprising a stimulable europium activated cesium bromide phosphor having the formula (I):

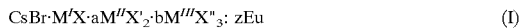

$$CsBr \cdot M^I X \cdot aM^{II}X'_2 \cdot bM^{III}X''_3 : zEu \quad (I)$$

in which $M^I$ is at least one alkali metal element selected from the group consisting of Li, Na, K and Rb; $M^{II}$ is at least one alkaline earth metal element or divalent metal element selected from the group consisting of Be, Mg, Ca, Sr, Ba, Ni, Cu, Zn and Cd; $M^{III}$ is at least one rare earth element or trivalent metal element selected from the group consisting of Sc, Y, La, Ce, Pr, Nd, Pm, Sm, Eu, Gd, Tb, Dy, Ho, Er, Tm, Yb, Lu, Al, Ga and In; each of X, X' and X" independently is at least one halogen selected from the group consisting of F, Cl, Br and I; and a, b, c and z are numbers satisfying the conditions of 0 a<0.5, 0 b<0.5, 0 c<0.5, and 0<z<1.0, which comprises the steps of:

depositing on the support a prismatic europium activated cesium bromide phosphor crystal layer on the support in a gas phase; and heating the crystal layer at a temperature of lower than 300° C. but not lower than 50° C. for a period of 1 to 8 hours in an inert gas atmosphere or an inert gas atmosphere containing a small amount of oxygen or hydrogen.

In the process of the invention, it is preferred that the prismatic crystal in the phosphor layer has a diameter of 1 to 10 μm, a height of 10 to 1,000 μm, and an aspect ratio of 10 to 1,000. In the formula (1), z preferably satisfies the condition of 0.001 z 0.01.

DETAILED DESCRIPTION OF THE INVENTION

Figure 1:
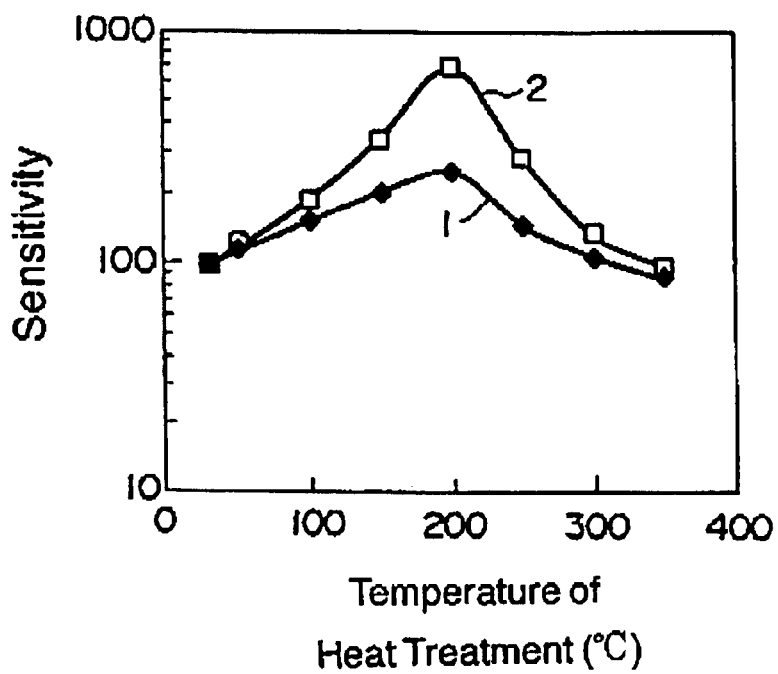
FIG. 1 graphically shows a relationship between the temperature for heat treatment of the deposited layer and the sensitivity of the resulting radiation image storage panel.

In the process of the invention, the heating of the crystal layer is preferably performed at a temperature of 50° C. to 280° C., more preferably 150° C. to 250° C., for 1 to 4 hours. The gas phase deposition preferably is vapor deposition. It is preferred that the vapor deposition is performed under the condition that the support is heated at a temperature of 50° C. to 300° C., preferably 100° C. to 290° C. It is further preferred that the vapor deposition is performed using plural vaporization sources which comprise at least one vaporization sources comprising matrix component including cesium bromide and one vaporization source containing an europium component. It is furthermore preferred that the vapor deposition is performed by the steps of initially depositing on the support a layer comprising the matrix component and subsequently depositing a phosphor layer comprising the matrix component and the matrix component.

In the formula (I), z representing the amount of the activator component Eu preferably satisfies $0.001 \leq z \leq 0.01$, because the stimulable phosphor layer comprising the phosphor crystals of the formula (I) in which z in this range shows a prominently high activation efficiency as well as a prominently high electron movement efficiency to increase the amount of the stimulated emission and further to increase the strength of the deposited phosphor layer. If the strength of the deposited phosphor layer increases, the phosphor layer show high heat resistance so that it hardly suffers from damages such as production of cracks in the phosphor layer.

It is preferred that $M^X$ is K and/or Rb and X is Cl and/or Br.

If desired, a metal oxide such as aluminum oxide, silicon oxide, or zirconium oxide can be incorporated into the phosphor composition under the condition that the amount of metal oxide is less than 0.5 mol per one mol of CsBr.

The preparation of a radiation image storage panel of the invention is described below by referring to the case of employing an electron beam deposition procedure.

The radiation image storage panel comprises a substrate (i.e., support) and a phosphor film deposited on the substrate. The substrate can be selected from those employed in the conventional radiation image storage panels. The substrate preferably are sheets of quartz glass, sapphire glass, metal (e.g., aluminum, iron, tin, or chromium) or heat-resistant resins (e.g., aramide).

It is known that a radiation image storage panel may have a light-reflecting layer containing a light-reflecting material such as titanium dioxide or a light-absorbing layer containing a light-absorbing material such as carbon black. A radiation image storage panel prepared by the process of the invention may have the light-reflecting layer or a light-absorbing layer. The radiation image storage panel also may have an adhesive layer on the surface of the substrate on which the phosphor layer is deposited. The substrate may have concaves or convexes on the surface of the substrate on which the phosphor layer is deposited.

On the substrate (or support), the stimulable phosphor layer is formed by gas phase deposition.

For the preparation of the phosphor layer of the radiation image storage panel, it is preferred to employ two or more vaporization sources such as a vaporization source comprising a matrix component and a vaporization source comprising an activator component such as an europium compound for the vaporization procedure.

Generally, the europium compound comprises a divalent europium ($Eu^{2+}$) compound and a trivalent ($Eu^{3+}$) compound. It is preferred that the europium compound contains the divalent europium compound as much as possible, at least 70%. The europium compound preferably is $EuBr_x$ in which $2.0 \leq x \leq 2.3$.

The evaporation source preferably has a water content of less than 0.5 wt. %.

The evaporation source preferably has an alkali metal impurity (other than the alkali metal of the phosphor component) of less than 10 ppm and an alkaline earth metal impurity (other than the alkaline earth metal of the phosphor component) of less than 1 ppm.

The evaporation source preferably is in the form of a tablet having a relative density of 80% to 98%, more preferably 90% to 96%. The tablet can be produced at 50 to 200° C. under pressure 800 to 1,000 kg/cm$^2$. Thus produced tablet can be subjected to degassing treatment.

The vapor deposition can be performed in a commercially available vapor deposition apparatus according to the known procedure.

In the vapor deposition apparatus, the evaporation sources and a substrate on which the phosphor film is to be deposited are set. The apparatus is then evacuated to give an inner pressure of $1 \times 10^{-5}$ to $1 \times 10^{-2}$ Pa. An inert gas such as Ar gas, Ne gas or N$_2$ gas may be incorporated into the apparatus. The oxygen gas partial pressure in the apparatus preferably is in the range of $1 \times 10^{-6}$ to $1 \times 10^{-2}$ Pa. The moisture vapor partial pressure in the apparatus preferably is less than $7.0 \times 10^{-3}$.

In the apparatus, the substrate is preferably heated at 50 to 300° C., more preferably 100 to 290° C., by means of a heater which may be attached to the back surface of the substrate.

In the vapor deposition apparatus, an electron beam generated by an electron gun is applied onto the vapor source. The accelerating voltage of electron beam preferably is in the range of 1.5 kV to 5.0 kV.

By applying the electron beam, the evaporation source is heated, vaporized, and deposited on the substrate. The deposition rate of the phosphor generally is in the range of 0.1 to 1,000 μm/min., preferably in the range of 1 to 100 μm/min. The electron beam may be applied twice or more to form two or more phosphor films.

A single evaporation source which comprises the stimulable phosphor per se also can be utilized.

The vapor deposition method used in the invention is not restricted to the electron beam-evaporating method, and various methods such as resistance-heating method and sputtering method can be used.

In the above-described manner, the phosphor layer in which the prismatic stimulable phosphor crystals are aligned almost perpendicularly to the substrate is formed. Thus formed phosphor film comprises only the stimulable phosphor with no binder, and there are produced cracks extending the depth direction in the phosphor film.

If desired, in advance of the deposition of the stimulable phosphor layer, a phosphor matrix layer comprising only the phosphor matrix component may be deposited on the substrate so as to prepare a phosphor layer having good shaped prismatic phosphor crystals in the phosphor layer. The activator component or other components in the stimulable phosphor layer can diffuse into the lower phosphor matrix layer during the heat treatment which is applied to the deposited layer. Therefore, the boundary not always is clear.

The gas phase deposition of the stimulable phosphor material can be carried out not only by the electron beam method but also a resistance heating method, a sputtering method or chemical vapor deposition (CVD) method.

Thus deposited phosphor layer is a layer of prismatic phosphor crystals. Each of the prismatic phosphor crystals preferably has a diameter in the range of 1 to 10 μm, a height in the range of 10 to 1,000 μm, and an aspect ratio of height/diameter in the range of 10 to 1,000.

According to the invention, the deposited phosphor layer is heated at a temperature of lower than 300° C. but not lower than 50° C. for 1 to 8 hours. The heating procedure is carried out in an inert gas atmosphere which may contain a small amount of oxygen or hydrogen gas. Examples of the inert gases include N$_2$ gas, Ar gas and Ne gas. The oxygen gas or hydrogen gas may be present at a partial pressure of 2,000 Pa or lower. The heating temperature preferably is in the range of 50 to 250° C., more preferably 150 to 250° C. The heating period preferably is in the range of 1 to 4 hours. The heating procedure can be applied to the deposited phosphor layer just after the deposition is made or after the phosphor layer-deposited substrate is taken out of the vapor deposition apparatus.

The oxygen atoms which are incorporated into the phosphor crystals in the course of deposition and serve to compensate the electric charge of the activator component Eu to form an Eu—O complex. By the heat treatment applied to the deposited phosphor layer, the oxygen atoms are released from the complex and diffuse into the crystals, so that the efficiency of electron movement and the efficiency of activator component can be enhanced. As a result, the amount of stimulated emission released from the phosphor layer increases.

The phosphor film preferably has a thickness of 50 μm to 1 mm, more preferably 200 to 700 μm.

The heated phosphor layer can be transferred onto an optionally selected support, if desired. Otherwise, the heated phosphor layer can be employed without the substrate or a support.

It is preferred to provide a transparent protective film on the surface of the stimulable phosphor film, so as to ensure good handling of the radiation image storage panel in transportation and to avoid deterioration. The protective film is preferably transparent. Further, for protecting the storage panel from chemical deterioration and physical damage, the protective film must be chemically stable, physically strong, and of high moisture proof. A moisture permeability of the protective film (at 25° C.) preferably is not higher than 300 g/m$^2$·24 hr·μm.

The protective film can be provided by coating the stimulable phosphor film with a solution in which an organic polymer (e.g., cellulose derivatives, polymethyl methacrylate, fluororesins soluble in organic solvents) is dissolved in a solvent, by placing a beforehand prepared sheet for the protective film (e.g., a film of organic polymer such as polyethylene terephthalate, a transparent glass plate) on the phosphor film with an adhesive, or by depositing vapor of inorganic compounds on the phosphor film.

Various additives may be dispersed in the protective film. Examples of the additives include light-scattering fine particles (e.g., particles of magnesium oxide, zinc oxide, titanium dioxide and alumina), a slipping agent (e.g., powders of perfluoroolefin resin and silicone resin) and a crosslinking agent (e.g., polyisocyanate). The thickness of the protective film generally is in the range of about 0.1 to 20 μm (if the film is made of polymer material) or in the range of about 100 to 1,000 μm (if the film is made of inorganic material such as glass). For enhancing the resistance to stain, a fluororesin layer is preferably provided on the protective film. The fluororesin layer can be form by coating the surface of the protective film with a solution in which a fluororesin is dissolved or dispersed in an organic solvent, and drying the coated solution. The fluororesin may be used singly, but a mixture of the fluororesin and a film-forming resin can be employed. In the mixture, an oligomer having polysiloxane structure or perfluoroalkyl group can be further added. In the fluororesin layer, fine particle filler may be incorporated to reduce blotches caused by interference and to improve the quality of the resultant image. The thickness of the fluororesin layer is generally in the range of 0.5 to 20 μm. For forming the fluororesin layer, additives such as a crosslinking agent, a film-hardening agent and an anti-yellowing agent can be used. In particular, the crosslinking agent is advantageously employed to improve durability of the fluororesin layer.

Thus, the radiation image storage panel is manufactured. The radiation image storage panel of the invention may have known various structures. For example, in order to improve the sharpness of the resultant image, at least one of the films may be colored with a colorant which does not absorb the stimulated emission but the stimulating rays.

The present invention is further described by the following examples.

EXAMPLE 1

One Source-Evaporation (1) Preparation of CsBr:Eu Evaporation Source

CsBr (100 g, 0.47 mol.) and $EuBr_{2.2}$ (0.462 g, $1.4 \times 10^{-3}$ mol) were placed and mixed in a mixer.

The obtained mixture was placed in a firing furnace. The furnace was evacuated, and then a nitrogen gas was introduced into the furnace to reach an atmospheric pressure. The mixture was then fired in the nitrogen atmosphere to 525° C. for one hour. The furnace was then evacuated for 5 minutes, and an oxygen gas was introduced into the furnace to reach 133 Pa. The mixture was further fired for one hour. After the firing was complete, the fired mixture was cooled in vacuo to room temperature and subsequently pulverized in a mortar to give a powdery CsBr:0.003 Eu phosphor.

The powdery phosphor was placed in a powder-molding zirconia die (inner diameter: 35 mm) and pressed at 50 MPa using a powder press-molding machine (Table Press TB-5, available from NPA System Co., Ltd.) to give a tablet (diameter: 35 mm, thickness: 20 mm). The pressure actually applied to the powdery mixture was approx. 40 MPa.

The table was dehydrated at 200° C. for 2 hours in an evacuated chamber. The resulting table had a density of 3.9 $g/cm^3$, and a water content of 0.3 wt. %.

(2) Formation of Phosphor Layer

A synthetic quartz substrate was washed successively with an aqueous alkaline solution, purified water, and isopropyl alcohol, and then mounted onto a holder within a vapor deposition apparatus. In the vapor deposition apparatus, the CsBr:Eu evaporation source was placed in the predetermined site. Subsequently, the apparatus was evacuated to reach $1 \times 10^{-3}$ Pa. The evacuation was carried out by means of a combination of a rotary pump, a mechanical booster, and a turbo molecular pump.

The quartz substrate was heated to 200° C. by a sheath heater positioned on the backside of the substrate.

An electron beam from an electron gun (accelerating voltage: 4.0 kV) was applied onto the evaporation source so as to deposit the stimulable phosphor on the substrate at a deposition rate of 4 $\mu$m/min. The water (moisture) vapor partial pressure in the evaporation atmosphere was $4 \times 10^{-3}$ Pa.

After the deposition was complete, the inner pressure was returned to atmospheric pressure, and the quartz substrate was taken out of the apparatus. On the quartz substrate, a phosphor deposited layer (thickness: approx. 400 $\mu$m, area; 10 cm×10 cm) consisting of prismatic phosphor crystals (each crystal having a width of approx. 5 $\mu$m, a length of approx. 400 $\mu$m, and an aspect ratio of approx. 50) aligned densely and perpendicularly was formed. The sizes of the phosphor crystals were measured by means of a scanning electron microscope (JSM-5400 type, available from Japan Electron Microscope Co., Ltd.).

The quartz substrate having the deposited phosphor layer was placed in a vacuum oven having a gas inlet. The vacuum oven was evacuated to approx. 1 Pa using a rotary pump to remove moisture or the like from the deposited phosphor layer. The deposited phosphor layer was then heated at 200° C. for 2 hours in a nitrogen atmosphere. The heated phosphor layer was cooled in an evacuated oven, and the quartz substrate having the heated phosphor layer was taken out of the oven.

Thus, a radiation image storage panel of the invention having a substrate and a deposited phosphor film was prepared.

EXAMPLES 2 TO 4

One Source-Evaporation

The procedures of Example 1 were repeated except that the temperature of heat treatment in the formation of phosphor layer of Example 1-(2) was changed into 100° C., 150° C., or 250° C., to prepare various radiation image storage panels of the invention.

COMPARISON EXAMPLE 1

One Source-Evaporation

The procedures of Example 1 were repeated except that the substrate was not heated and kept to room temperature in the formation of phosphor layer of Example 1-(2) and no heat treatment was carried out on the deposited phosphor layer, to prepare a radiation image storage panel for comparison. The phosphor layer deposited on the quartz substrate had not a satisfactory prismatic phosphor crystal structure.

COMPARISON EXAMPLE 2

One Source-Evaporation

The procedures of Example 1 were repeated except that the substrate was not heated and kept to room temperature in the formation of phosphor layer of Example 1-(2), to prepare a radiation image storage panel for comparison. The phosphor layer deposited on the quartz substrate had not a satisfactory prismatic phosphor crystal structure.

COMPARISON EXAMPLE 3

One Source-Evaporation

The procedures of Example 1 were repeated except that no heat treatment was carried out on the deposited phosphor layer in the formation of phosphor layer of Example 1-(2), to prepare a radiation image storage panel for comparison.

COMPARISON EXAMPLE 4

One Source-Evaporation

The procedures of Example 1 were repeated except that the temperature of heat treatment was changed into 350° C. in the formation of phosphor layer of Example 1-(2), to prepare a radiation image storage panel for comparison.

EXAMPLE 5

One Source-Evaporation

The procedures of Example 1 were repeated except that the amount of $EuBr_x$ was changed into 0.1540 g ($4.7 \times 10^{-4}$ mol) to give a powdery CsBr:0.001Eu phosphor in the procedure of preparation of CsBr:Eu evaporation source of Example 1-(1), to prepare a radiation image storage panel of the invention.

COMPARISON EXAMPLE 5

One Source-Evaporation

The procedures of Example 5 were repeated except that no heat treatment was carried out on the deposited phosphor layer, to prepare a radiation image storage panel for comparison.

EXAMPLE 6

One Source-Evaporation

The procedures of Example 1 were repeated except that the amount of $EuBr_x$ was changed into 0.2321 g ($3.8\times10^{-3}$ mol) to give a powdery CsBr:0.008Eu phosphor in the procedure of preparation of CsBr:Eu evaporation source of Example 1-(1), to prepare a radiation image storage panel of the invention.

COMPARISON EXAMPLE 6

One Source-Evaporation

The procedures of Example 6 were repeated except that no heat treatment was carried out on the deposited phosphor layer, to prepare a radiation image storage panel for comparison.

[Evaluation of Radiation Image Storage Panel—I]

Each of the obtained radiation image storage panels was evaluated in the sensitivity, the conditions of prismatic crystals, and the adhesion to the substrate in the below-described manners. Further, a mean aspect ratio of the prismatic crystals was obtained.

(1) Sensitivity

The radiation image storage panel was placed in a light-shielding cassette and irradiated with X-rays (tube voltage 80 kVp). The storage panel was then taken out of the cassette. Subsequently, the storage panel was irradiated on its surface with laser light (wavelength:633 nm) and simultaneously the light emission released from the phosphor layer was detected by a photo-multiplier to determine the amount of stimulated emission. The amount of the detected emission was expressed as a relative sensitivity.

(2) Conditions of Prismatic Crystals

The phosphor layer and the substrate of the radiation image storage panel was sectioned in the thickness direction. The sectioned face was coated with gold (thickness: 300 angstroms) by ion sputtering for avoiding charge-up, and observed on the surface and sectioned face of the phosphor layer by means of a scanning electron microscope (JSM-5400 type, available from Japan Electron Co., Ltd.). The conditions in that satisfactory prismatic crystals are not formed are marked as "worse".

(3) Adhesion to the Substrate (Support)

The adhesion was evaluated by peeling the phosphor layer from the substrate.

The results are set forth in Table 1 and illustrated in FIG. 1.

TABLE 1

| Example (Eu) | Temp. of substrate | Heat treatment temp./time/atm. | Sensitivity (Prismatic) | Adhesion (Asp.R.) |
|---|---|---|---|---|
| Exam. 2 (0.003) | 200° C. | 100° C./2 hrs/$N_2$ | 153 (better) | good (50) |
| Exam. 3 (0.003) | 200° C. | 150° C./2 hrs/$N_2$ | 202 (better) | good (50) |
| Exam. 1 (0.003) | 200° C. | 200° C./2 hrs/$N_2$ | 251 (better) | good (50) |
| Exam. 4 (0.003) | 200° C. | 250° C./2 hrs/$N_2$ | 147 (better) | good (50) |
| Com. Ex. 1 (0.003) | room temp. | —/—/— | 100 (worse) | better (1) |
| Com. Ex. 2 (0.003) | room temp. | 200° C./2 hrs/$N_2$ | 110 (worse) | good (1) |
| Com. Ex. 3 (0.003) | 200° C. | —/—/— | 100 (better) | good (50) |
| Com. Ex. 4 (0.003) | 200° C. | 350° C./2 hrs/$N_2$ | 87 (worse) | worse (45) |
| Exam. 5 (0.001) | 200° C. | 200° C./2 hrs/$N_2$ | 185 (better) | good (55) |
| Com. Ex. 5 (0.001) | 200° C. | —/—/— | 100 (better) | good (55) |
| Exam. 6 (0.008) | 200° C. | 200° C./2 hrs/$N_2$ | 137 (good) | good (60) |
| Com. Ex. 6 (0.008) | 200° C. | —/—/— | 100 (good) | good (60) |

Remarks:
Eu: Eu content
Prismatic: Conditions of prismatic crystals
Asp.R.: Aspect Ratio FIG. 1 graphically shows a relationship between the temperature for heat treatment of the deposited layer and the sensivity of the radiation image storage panel.

Curve 1 is for the one-evaporation source system (Examples 1–4).

The results shown in Table 1 indicate the following:

(1) If the deposited stimulable CsBr:Eu phosphor layer does not comprise satisfactory prismatic crystals, the heat treatment of the deposited phosphor layer enhances the sensitivity only by approx. 10% (Comparison Examples 1 and 2).

(2) In contrast, if the deposited phosphor layer comprises satisfactory prismatic crystals, the heat treatment of the deposited phosphor layer enhances the sensitivity by at least 50% and at most 150% (Examples 1–4).

The results in FIG. 1 (Curve 1) indicate the following:

(1) It is apparent that the prominent enhancement of the sensitivity by the heat treatment appears in the temperature range of 50 to 300° C. (not inclusive), specifically 100 to 280° C., more specifically 100 to 250° C.

(2) The excessively high heat temperature causes lowering adhesion of the phosphor layer to the substrate and further the conditions of prismatic crystals are made worse.

EXAMPLE 7

Two Source-Evaporation (1) Preparation of CsBr Evaporation Source

A powdery CsBr (75 g) was placed in a powder-molding zirconia die (inner diameter:35 mm, depth:20 mm) and pressed at 50 MPa using a powder press-molding machine to give a tablet (diameter:35 mm, thickness:20 mm). The pressure actually applied to the powdery CsBr was approx. 40 MPa.

The table was dehydrated at 200° C. for 2 hours in an evacuated chamber. The resulting table had a density of 3.9 g/cm$^3$, and a water content of 0.3 wt. %.

(2) Preparation of $EuBr_x$ Evaporation Source

A powdery and $EuBr_{2.2}$ (25 g) was placed in a powder-molding zirconia die (inner diameter:25 mm) and pressed at 50 MPa using a-powder press-molding machine to give a tablet (diameter:25 mm, thickness:20 mm). The pressure actually applied to the powdery $EuBr_{2.2}$ Was approx. 80 MPa.

The table was dehydrated at 200° C. for 2 hours in an evacuated chamber. The resulting table had a density of 5.1 g/cm$^3$, and a water content of 0.5 wt. %.

(3) Formation of Phosphor Layer

A synthetic quartz substrate was washed successively with an aqueous alkaline solution, purified water, and isopropyl alcohol, and then mounted onto a holder within a vapor deposition apparatus. In the vapor deposition apparatus, the CsBr:Eu evaporation source and the $EuBr_x$ evaporation source were placed in the predetermined sites. Subsequently, the apparatus was evacuated to reach $1 \times 10^{-3}$ Pa. The evacuation was carried out by means of a combination of a rotary pump, a mechanical booster, and a turbo molecular pump.

The quartz substrate was heated to 200° C. by a sheath heater positioned on the backside of the substrate.

An electron beam from an electron gun (accelerating voltage: 4.0 kV) was applied onto the evaporation sources so as to deposit the stimulable CsBr:Eu phosphor on the substrate at a deposition rate of 10 $\mu$m/min, under the condition that the emission current of the electron gum was controlled to give a Eu/Cs molar ratio of 0.003/1 in the deposited phosphor layer. When it was required, the evaporation sources were supplied by means of a revolver, to deposit the phosphor layer of the desired thickness. The water (moisture) vapor partial pressure in the evaporation atmosphere was $4 \times 10^{-3}$ Pa.

After the deposition was complete, the inner pressure was returned to atmospheric pressure, and the quartz substrate was taken out of the apparatus. On the quartz substrate, a phosphor deposited layer (thickness: approx. 400 $\mu$m, area: 10 cm×10 cm) consisting of prismatic phosphor crystals (each crystal having a width of approx. 5 $\mu$m, a length of approx. 400 $\mu$m, and an aspect ratio of approx. 60) aligned densely and perpendicularly was formed. The sizes of the phosphor crystals were measured by means of a scanning electron microscope.

The quartz substrate having the deposited phosphor layer was placed in a vacuum oven having a gas inlet. The vacuum oven was evacuated to approx. 1 Pa using a rotary pump to remove moisture or the like from the deposited phosphor layer. The deposited phosphor layer was then heated at 200° C. for 2 hours in a nitrogen atmosphere. The heated phosphor layer was cooled in an evacuated oven, and the quartz substrate having the heated phosphor layer was taken out of the oven.

Thus, a radiation image storage panel of the invention having a substrate and a deposited phosphor film was prepared.

EXAMPLES 8 TO 12

Two Source-Evaporation

The procedures of Example 7 were repeated except that the temperature of heat treatment in the formation of phosphor layer of Example 7-(3) was changed into 50° C., 100° C., 150° C., 250° C., or 300° C., to prepare various radiation image storage panels of the invention.

EXAMPLES 13 & 14

Two Source-Evaporation

The procedures of Example 7 were repeated except that the period of time for the heat treatment in the formation of phosphor layer of Example 7-(3) was changed into one hour or 4 hours, to prepare radiation image storage panels of the invention.

EXAMPLES 15 TO 17

Two Source-Evaporation

The procedures of Example 7 were repeated except that the heat treatment was carried out in a nitrogen gas atmosphere containing a small amount of oxygen ($O_2$ partial pressure:133 Pa, 400 Pa, or 1330 Pa) in the formation of phosphor layer of Example 7-(3), to prepare various radiation image storage panels of the invention.

EXAMPLES 18 TO 20

Two Source-Evaporation

The procedures of Example 7 were repeated except that the heat treatment was carried out in a nitrogen gas atmosphere containing a small amount of hydrogen ($H_2$ partial pressure:133 Pa, 400 Pa, or 1330 Pa) in the formation of phosphor layer of Example 7-(3), to prepare various radiation image storage panels of the invention.

COMPARISON EXAMPLE 7

Two Source-Evaporation

The procedures of Example 7 were repeated except that the substrate was not heated and kept to room temperature in the formation of phosphor layer of Example 7-(3) and no heat treatment was carried out on the deposited phosphor layer, to prepare a radiation image storage panel for comparison. The phosphor layer deposited on the quartz substrate had not a satisfactory prismatic phosphor crystal structure.

COMPARISON EXAMPLE 8

Two Source-Evaporation

The procedures of Example 7 were repeated except that the substrate was not heated and kept to room temperature in the formation of phosphor layer of Example 7-(3), to prepare a radiation image storage panel for comparison. The phosphor layer deposited on the quartz substrate had not a satisfactory prismatic phosphor crystal structure.

COMPARISON EXAMPLE 9

Two Source-Evaporation

The procedures of Example 7 were repeated except that no heat treatment was carried out on the deposited phosphor layer in the formation of phosphor layer of Example 7-(3), to prepare a radiation image storage panel for comparison.

COMPARISON EXAMPLE 10

Two Source-Evaporation

The procedures of Example 7 were repeated except that the temperature of heat treatment was changed into 350° C. in the formation of phosphor layer of Example 7-(3), to prepare a radiation image storage panel for comparison.

COMPARISON EXAMPLE 11

Two Source-Evaporation

The procedures of Example 7 were repeated except that the period of time for the heat treatment was changed into 12 hours in the formation of phosphor layer of Example 7-(3), to prepare a radiation image storage panel for comparison.

EXAMPLE 21

Two Source-Evaporation

The procedures of Example 7 were repeated except that the emission current of the electron gun was controlled to give a Eu/Cs molar ratio of 0.001/1 in the deposited phosphor layer in the formation of phosphor layer of Example 7-(3) was changed into one hour or 4 hours, to prepare radiation image storage panels of the invention.

COMPARISON EXAMPLE 12

Two Source-Evaporation

The procedures of Example 21 were repeated except that no heat treatment was carried out on the deposited phosphor layer in the formation of phosphor layer of Example 21, to prepare a radiation image storage panel for comparison.

EXAMPLE 22

Two Source-Evaporation

The procedures of Example 7 were repeated except that the emission current of the electron gun was controlled to give a Eu/Cs molar ratio of 0.008/1 in the deposited phosphor layer in the formation of phosphor layer of Example 7-(3) was changed into one hour or 4 hours, to prepare radiation image storage panels of the invention.

COMPARISON EXAMPLE 13

Two Source-Evaporation

The procedures of Example 22 were repeated except that no heat treatment was carried out on the deposited phosphor layer in the formation of phosphor layer of Example 22, to prepare a radiation image storage panel for comparison.

[Evaluation of Radiation Image Storage Panel—II]

Each of the obtained radiation image storage panels was evaluated in the sensitivity, the conditions of prismatic crystals, and the adhesion to the substrate in the aforementioned manners. Further, a mean aspect ratio of the prismatic crystals was obtained.

Figure 2:
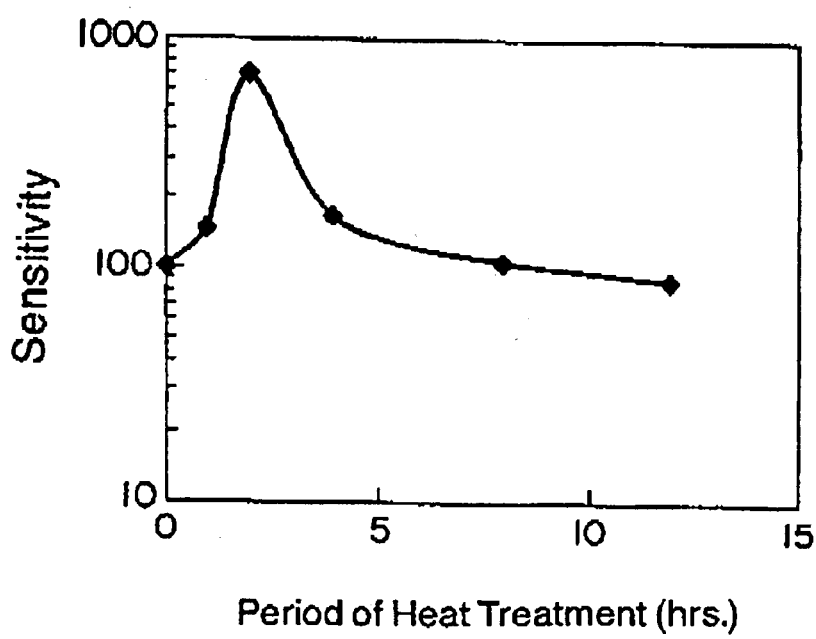
FIG. 2 also graphically shows a relationship between the temperature for heat treatment of the deposited layer and the sensitivity of the resulting radiation image storage panel.

The results are set forth in Tables 2 and 3 and illustrated in FIGS. 1 and 2.

TABLE 2

| Example (Eu) | Temp. of substrate | Heat treatment temp/time/atm. | Sensitivity (Prismatic) | Adhesion (Asp.R.) |
|---|---|---|---|---|
| Exam. 8 (0.003) | 200° C. | 50° C./2 hrs/N$_2$ | 117 (better) | good (60) |
| Exam. 9 (0.003) | 200° C. | 100° C./2 hrs/N$_2$ | 186 (better) | good (60) |
| Exam. 10 (0.003) | 200° C. | 150° C./2 hrs/N$_2$ | 343 (better) | good (60) |
| Exam. 7 (0.003) | 200° C. | 200° C./2 hrs/N$_2$ | 694 (better) | good (60) |
| Exam. 11 (0.003) | 200° C. | 250° C./2 hrs/N$_2$ | 288 (better) | good (60) |
| Exam. 12 (0.003) | 200° C. | 300° C./2 hrs/N$_2$ | 133 (better) | good (60) |
| Exam. 13 (0.003) | 200° C. | 200° C./1 hr/N$_2$ | 148 (better) | good (60) |
| Exam. 14 (0.003) | 200° C. | 250° C./4 hrs/N$_2$ | 169 (better) | good (60) |

TABLE 2-continued

| Example (Eu) | Temp. of substrate | Heat treatment temp/time/atm. | Sensitivity (Prismatic) | Adhesion (Asp.R.) |
|---|---|---|---|---|
| Com. Ex. 7 (0.003) | room temp. | —/—/— | 100 (worse) | better (1) |
| Com. Ex. 8 (0.003) | room temp. | 200° C./2 hrs/N$_2$ | 107 (worse) | better (1) |
| Com. Ex. 9 (0.003) | 200° C. | —/—/— | 100 (better) | good (60) |
| Com. Ex. 10 (0.003) | 200° C. | 350° C./2 hrs/N$_2$ | 96 (worse) | worse (55) |
| Com. Ex. 11 (0.003) | 200° C. | 200° C./2 hrs/N$_2$ | 91 (worse) | good (58) |

Remarks:
Eu: Eu content
Prismatic: Conditions of prismatic crystals
Asp.R.: Aspect Ratio

TABLE 3

| Example (Eu) | Temp. of substrate | Heat treatment temp./time/atm. | Sensitivity (Prismatic) | Adhesion (Asp.R.) |
|---|---|---|---|---|
| Exam. 15 (0.003) | 200° C. | 200° C./2 hrs/ N$_2$ + O$_2$ (133 Pa) | 155 (better) | good (60) |
| Exam. 16 (0.003) | 200° C. | 200° C./2 hrs/ N$_2$ + O$_2$ (403 Pa) | 329 (better) | good (60) |
| Exam. 17 (0.003) | 200° C. | 200° C./2 hrs/ N$_2$ + O$_2$ (1330 Pa) | 118 (better) | good (60) |
| Exam. 18 (0.003) | 200° C. | 200° C./2 hrs/ N$_2$ + H$_2$ (133 Pa) | 521 (better) | good (60) |
| Exam. 19 (0.003) | 200° C. | 200° C./2 hrs/ N$_2$ + H$_2$ (400 Pa) | 791 (better) | good (60) |
| Exam. 20 (0.003) | 200° C. | 200° C./2 hrs/ N$_2$ + O$_2$ (1330 Pa) | 566 (better) | good (60) |
| Exam. 21 (0.001) | 200° C. | 200° C./2 hrs/N$_2$ | 371 (better) | good (65) |
| Com. Ex. 12 (0.001) | 200° C. | —/—/— | 100 (better | good (65) |
| Exam. 22 (0.008) | 200° C. | 200° C./2 hrs/N$_2$ | 411 (good) | good (55) |
| Com. Ex. 13 (0.008) | 200° C. | —/—/— | 100 (good) | worse (55) |

Remarks:
Eu: Eu content
Prismatic: Conditions of prismatic crystals
Asp R.: Aspect Ratio FIG. 1 graphically shows a relationship between the temperature for heat treatment of the deposited layer ad the sensitivity of the radiation image storage panel. Curve 2 is for the two-evaporation source system (Examples 7–12).

The results shown in Tables 2 and 3 indicate the following:

(1) If the deposited stimulable CsBr:Eu phosphor layer does not comprise satisfactory prismatic crystals in the two-evaporation source system, the heat treatment of the deposited phosphor layer enhances the sensitivity only by approx. 7% (Comparison Examples 7 and 8).

(2) In contrast, if the deposited phosphor layer comprises satisfactory prismatic crystals, the heat treatment of the deposited phosphor layer enhances the sensitivity by at most as much as 8 times (Examples 7–20).

The results in FIG. 1 (Curve 2) indicate that the prominent enhancement of the sensitivity by the heat treatment appears in the temperature range of 50 to 300° C. (not inclusive), specifically 150 to 250° C.

The results graphically shown in FIG. 2 indicate the prominent increase of the sensitivity is observed in the heat treatment for 1 to 8 hours, specifically 1 to 4 hours.

EXAMPLE 23

Two Source-Evaporation For Deposition of Two Phosphor Layer

A synthetic quartz substrate was washed successively with an aqueous alkaline solution, purified water, and isopropyl alcohol, and then mounted onto a holder within a vapor deposition apparatus. In the vapor deposition apparatus, the CsBr:Eu evaporation source and the $EuBr_x$ evaporation source which were prepared in Example 7 were placed in the predetermined sites. Subsequently, the apparatus was evacuated to reach $1 \times 10^{-3}$ Pa. The evacuation was carried out by means of a combination of a rotary pump, a mechanical booster, and a turbo molecular pump.

The quartz substrate was heated to 200° C. by a sheath heater positioned on the backside of the substrate.

An electron beam from an electron gun (accelerating voltage: 4.0 kV) was applied first onto the CsBr evaporation source so as to deposit the stimulable CsBr phosphor matrix layer on the substrate for 2 minutes at a deposition rate of 10 μm/min. Subsequently, an electron beam from electron gun (accelerating voltage: 4.0 kV) was applied onto each of the evaporation sources to deposit the stimulable CsBr phosphor matrix layer on the CsBr phosphor matrix layer for 40 minutes at a deposition rate of 10 μm/min., under the condition that the emission current of the electron gum was controlled to give a Eu/Cs molar ratio of 0.005/1 in the deposited phosphor layer. The water (moisture) vapor partial pressure in the evaporation atmosphere was $4 \times 10^{-3}$ Pa.

After the deposition was complete, the inner pressure was returned to atmospheric pressure, and the quartz substrate was taken out of the apparatus. On the quartz substrate, a phosphor deposited layer (thickness: approx. 420 μm, area:10 cm×10 cm) consisting of prismatic phosphor crystals (each crystal having a width of approx. 5 μm, a length of approx. 420 μm, and an aspect ratio of approx. 65) aligned densely and perpendicularly was formed. The sizes of the phosphor crystals were measured by means of a scanning electron microscope.

The quartz substrate having the deposited phosphor layer was placed in a vacuum oven having a gas inlet. The vacuum oven was evacuated to approx. 1 Pa using a rotary pump to remove moisture or the like from the deposited phosphor layer. The deposited phosphor layer was then heated at 200° C. for 2 hours in a nitrogen atmosphere. The heated phosphor layer was cooled in an evacuated oven, and the quartz substrate having the heated phosphor layer was taken out of the oven.

Thus, a radiation image storage panel of the invention having a substrate and a deposited phosphor film was prepared.

EXAMPLES 24 TO 28

Two Source-Evaporation For Deposition of Two Phosphor Layer

The procedures of Example 23 were repeated except that the temperature of heat treatment in the formation of phosphor layer of Example 23 was changed into 50° C., 100° C., 150° C., 250° C., or 300° C., to prepare various radiation image storage panels of the invention.

COMPARISON EXAMPLE 14

Two Source-Evaporation For Deposition of Two Phosphor Layer

The procedures of Example 23 were repeated except that no heat treatment was carried out on the deposited phosphor layer in the formation of phosphor layer of Example 23, to prepare a radiation image storage panel for comparison.

[Evaluation of Radiation Image Storage Panel—III]

Each of the obtained radXdiation image storage panels was evaluated in the sensitivity, the conditions of prismatic crystals, and the adhesion to the substrate in the aforementioned manners. Further, a mean aspect ratio of the prismatic crystals was obtained.

The results are set forth in Table 4.

TABLE 4

| Example (Eu) | Temp. of substrate | Heat treatment temp./time/atm. | Sensitivity (Prismatic) | Adhesion (Asp.R.) |
|---|---|---|---|---|
| Exam. 24 (0.005) | 200° C. | 50° C./2 hrs/$N_2$ | 126 (best) | better (65) |
| Exam. 25 (0.005) | 200° C. | 100° C./2 hrs/$N_2$ | 288 (best) | better (65) |
| Exam. 26 (0.005) | 200° C. | 150° C./2 hrs/$N_2$ | 650 (best) | better (65) |
| Exam. 23 (0.005) | 200° C. | 200° C./2 hrs/$N_2$ | 977 (best) | better (65) |
| Exam. 27 (0.005) | 200° C. | 250° C./2 hrs/$N_2$ | 755 (best) | better (65) |
| Exam. 28 (0.005) | 200° C. | 300° C./2 hrs/$N_2$ | 211 (best) | better (65) |
| Com. Ex. 14 (0.005) | 200° C. | —/—/— | 100 (worse) | better (1) |

Remarks:
Eu: Eu content
Prismatic: Conditions of prismatic crystals
Asp.R.: Aspect Ratio The results shown in Table 4 indicate the following:
(1) It the deposited CsBr:Eu phosphor layer comprises satisfactory prismatic crystals, the heat treatment of the deposited phosphor layer enhances the sensitivity prominently.
(2) The prominent enhancement of the sensitivity by the heat treatment appears in the temperature range of 50 to 300° C. (not inclusive), specifically 150 to 250° C. hours.

EXAMPLE 29

Two Source-Evaporation

The procedures of Example 7 were repeated except that the synthetic quartz substrate was replaced with a patterned synthetic quartz substrate and the emission current of the electron gun was controlled to give a Eu/Cs molar ratio of 0.005/1 in the deposited phosphor layer in the formation of phosphor layer of Example 23, to prepare a radiation image storage panel of the invention.

Figure 3:
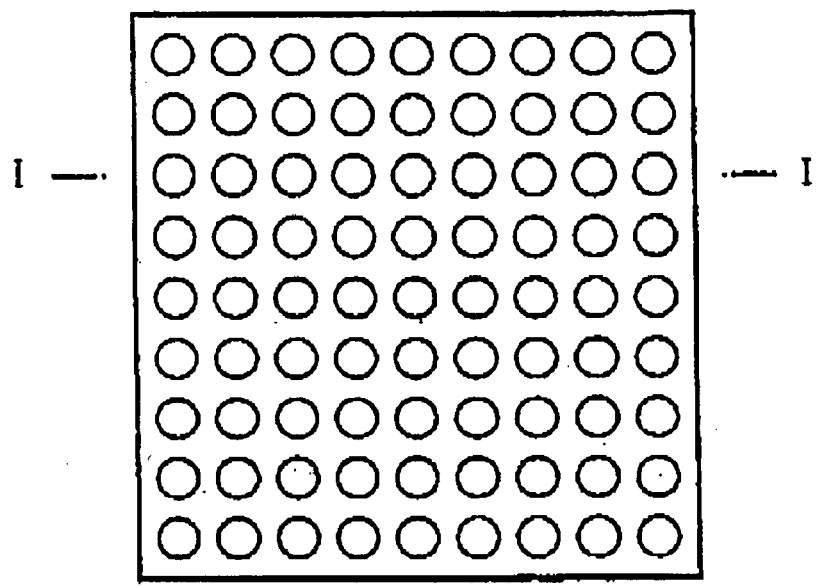
FIG. 3-(a) illustrates a plan view of a patterned synthetic quartz support and FIG. 3-(b) is a partially enlarged sectional view of the quartz support of FIG. 3-(a) taken along the line I—I.
Figure 3:
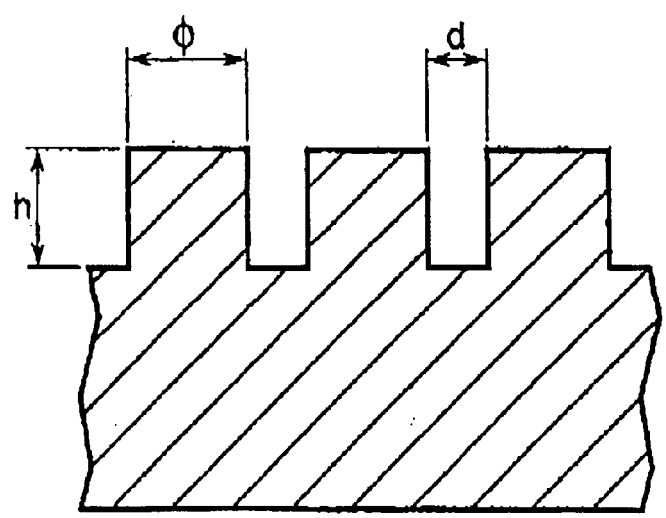

FIG. 3-(a) illustrates a plan view of the patterned synthetic quartz support and FIG. 3-(b) is a partially enlarged sectional view of the quartz support of FIG. 3-(a) taken along the line I—I. In FIG. 3-(b), each protrusion has a diameter (ϕ) of 5 μm, a height (h) of 5 μm, and a space (d) between the adjoining protrusions of 2 μm.

After the deposition was complete, it was confirmed that a phosphor deposited layer (thickness: approx. 400 μm, area:10 cm×10 cm) consisting of prismatic phosphor crystals (each crystal having a width of approx. 5 μm, a length of approx. 400 μm, and an aspect ratio of approx. 80) aligned densely and perpendicularly was formed on the quartz substrate. The sizes of the phosphor crystals were measured by means of a scanning electron microscope.

EXAMPLES 30 TO 33

Two Source-Evaporation

The procedures of Example 29 were repeated except that the temperature of heat treatment in the formation of phosphor layer of Example 29 was changed into 50° C., 100° C., 150° C., or 250° C., to prepare various radiation image storage panels of the invention.

COMPARISON EXAMPLE 15

Two Source-Evaporation

The procedures of Example 29 were repeated except that no heat treatment was carried out on the deposited phosphor layer in the formation of phosphor layer of Example 29, to prepare a radiation image storage panel for comparison.

COMPARISON EXAMPLE 16

Two Source-Evaporation

The procedures of Example 29 were repeated except that the heat treatment was carried out at 350° C. in the formation of phosphor layer of Example 29, to prepare a radiation image storage panel for comparison.

COMPARISON EXAMPLE 17

Two Source-Evaporation

The procedures of Example 29 were repeated except that the substrate was not heated and kept to room temperature and the heat treatment was carried out at 50° C. in the formation of phosphor layer of Example 29, to prepare a radiation image storage panel for comparison. The phosphor layer deposited on the quartz substrate had not a satisfactory prismatic phosphor crystal structure.

EXAMPLE 34

Two Source-Evaporation

The procedures of Example 29 were repeated except for employing a different patterned synthetic quartz substrate ($\phi$=2 μm, h=2 μm, d=1 μm), to prepare a radiation image storage panel of the invention.

COMPARISON EXAMPLE 18

Two Source-Evaporation

The procedures of Example 34 were repeated except that no heat treatment was carried out on the deposited phosphor layer in the formation of phosphor layer of Example 34, to prepare a radiation image storage panel for comparison.

EXAMPLE 35

Two Source-Evaporation

The procedures of Example 29 were repeated except for employing a different patterned synthetic quartz substrate ($\phi$=10 μm, h=10 μm, d=3 μm), to prepare a radiation image storage panel of the invention.

COMPARISON EXAMPLE 19

Two Source-Evaporation

The procedures of Example 35 were repeated except that no heat treatment was carried out on the deposited phosphor layer in the formation of phosphor layer of Example 35, to prepare a radiation image storage panel for comparison.

[Evaluation of Radiation Image Storage Panel—IV]

Each of the obtained radiation image storage panels was evaluated in the sensitivity, the conditions of prismatic crystals, and the adhesion to the substrate in the aforementioned manners, Further, a mean aspect ratio of the prismatic crystals was obtained.

The results are set forth in Table 5.

TABLE 5

| Example (Eu) | Temp/Pat of substrate | Heat treatment temp./time/atm. | Sensitivity (Prismatic) | Adhesion (Asp.R.) |
|---|---|---|---|---|
| Exam. 30 (0.005) | 200° C. (5 μm) | 50° C./2 hrs/$N_2$ | 175 (best) | best (80) |
| Exam. 31 (0.005) | 200° C. (5 μm) | 100° C./2 hrs/$N_2$ | 350 (best) | best (80) |
| Exam. 32 (0.005) | 200° C. (5 μm) | 150° C./2 hrs/$N_2$ | 550 (best) | best (80) |
| Exam. 29 (0.005) | 200° C. (5 μm) | 200° C./2 hrs/$N_2$ | 1250 (best) | best (80) |
| Com. Ex. 15 (0.005) | 200° C. (5 μm) | —/—/— | 100 (worse) | best (80) |
| Com. Ex. 16 (0..005) | 200° C. (5 μm) | 350° C./2 hrs/$N_2$ | 100 (best) | best (80) |
| Com. Ex. 17 (0.005) | R.T. (5 μm) | 50° C./2 hrs/$N_2$ | 100 (best) | best (5) |
| Exam. 34 (0.005) | 200° C. (2 μm) | 200° C./2 hrs/$N_2$ | 980 (best) | best (200) |
| Com. Ex. 18 (0.005) | 200° C. (2 μm) | —/—/— | 100 (best) | best (200) |
| Exam. 35 (0.005) | 200° C. (10 μm) | 200° C./2 hrs/$N_2$ | 880 (best) | best (40) |
| Com. EX. 19 (0.005) | 200° C. (10 μm) | —/—/— | 100 (best) | best (40) |

Remarks:
Eu: Eu content
Prismatic: Conditions of prismatic crystals
Asp.R.: Aspect Ratio The results shown in Table 5 indicate the following:
(1) If the deposited CsBr:Eu phosphor layer comprises satisfactory prismatic crystals, the heat treatment of the deposited phosphor layer enhances the sensitivity prominently.
(2) The prominent enhancement of the sensitivity by the heat treatment appears in the temperature range of 50 to 250° C., specifically 100 to 250° C. hours.

What is claimed is:
1. A process for preparing a radiation image storage panel comprising a support and a phosphor film comprising a stimulable europium activated cesium bromide phosphor having the formula (I):

$$CsBr.M^IX-aM^{II}X'_2+bM^{III}X''_3:zEu \qquad (I)$$

in which $M^I$ is at least one alkali metal element selected from the group consisting of Li, Na, K and Rb; $M^{II}$ is at least one alkaline earth metal element or divalent metal element selected from the group consisting of Be, Mg, Ca, Sr, Ba, Ni, Cu, Zn and Cd; $M^{III}$ is at least one rare earth element or trivalent metal element selected from the group consisting of Sc, Y, La, Ce, Pr, Nd, Pm, Sm, Eu, Gd, Tb, Dy, Ho, Er, Tm, Yb, Lu, Al, Ga and In; each of X, X' and X" independently is at least one halogen selected from the group consisting of F, Cl, Br and I; and a, b, c and z are numbers satisfying the conditions of $0 \leq a<0.5$, $0 \leq b<0.5$, $0 \leq c<0.5$, and $0<z<1.0$, which comprises the steps of:

depositing on the support a prismatic europium activated cesium bromide phosphor crystal layer on the support in a gas phase; and heating the crystal layer at a temperature of lower than 300° C. but not lower than 50° C. for a period of 1 to 8 hours in an inert gas atmosphere or an inert gas atmosphere containing a small amount of oxygen or hydrogen.

2. The process of claim 1, wherein the prismatic crystal in the phosphor layer has a diameter of 1 to 10 μm, a height of 10 to 1,000 μm, and an aspect ratio of 10 to 1,000.

3. The process of claim 1, wherein z satisfies the condition of $0.001 \leq z \leq 0.01$.

4. The process of claim 1, wherein the heating of the crystal layer is performed at a temperature of 50° C. to 280° C.

5. The process of claim 1, wherein the heating of the crystal layer is performed at a temperature of 150° C. to 250° C.

6. The process of claim 1, wherein the deposition is performed by vapor deposition.

7. The process of claim 6, wherein the vapor deposition is performed under the condition that the support is heated at a temperature of 50° C. to 300° C.

8. The process of claim 7, wherein the vapor deposition is performed under the condition that the support is heated at a temperature of 100° C. to 290° C.

9. The process of claim 6, wherein the vapor deposition is performed using plural vaporization sources which comprise at least one vaporization source comprising matrix component including cesium bromide and one vaporization source containing an europium component.

10. The process of claim 6, wherein the vapor deposition is performed by the steps of initially depositing on the support a layer comprising the matrix component and subsequently depositing a phosphor layer comprising the matrix component and an europium component.

* * * * *

UNITED STATES PATENT AND TRADEMARK OFFICE
CERTIFICATE OF CORRECTION

PATENT NO. : 6,852,357 B2 Page 1 of 1
APPLICATION NO. : 10/395223
DATED : February 8, 2005
INVENTOR(S) : Yuji Isoda et al.

It is certified that error appears in the above-identified patent and that said Letters Patent is hereby corrected as shown below:

Title Page (*) Notice

"Subject to any disclaimer, the term of this patent is extended or adjusted under 35 U.S.C. 154(b) by 0 days"

Should read

--Subject to any disclaimer, the term of this patent is extended or adjusted under 35 U.S.C. 154(b) by 82 days--

Signed and Sealed this

Twenty-first Day of August, 2007

JON W. DUDAS
*Director of the United States Patent and Trademark Office*